(12) United States Patent
Kadoi

(10) Patent No.: US 9,824,856 B2
(45) Date of Patent: Nov. 21, 2017

(54) DEPOSITION METHOD AND FOCUSED ION BEAM SYSTEM

(71) Applicant: JEOL Ltd., Tokyo (JP)

(72) Inventor: Misumi Kadoi, Tokyo (JP)

(73) Assignee: JEOL Ltd., Tokyo (JP)

( * ) Notice: Subject to any disclaimer, the term of this patent is extended or adjusted under 35 U.S.C. 154(b) by 151 days.

(21) Appl. No.: 14/956,725

(22) Filed: Dec. 2, 2015

(65) Prior Publication Data

US 2016/0163507 A1   Jun. 9, 2016

(30) Foreign Application Priority Data

Dec. 3, 2014   (JP) .................................. 2014-244674

(51) Int. Cl.

| | |
|---|---|
| *C23C 14/00* | (2006.01) |
| *H01J 37/304* | (2006.01) |
| *C23C 14/22* | (2006.01) |
| *C23C 16/04* | (2006.01) |
| *H01J 37/317* | (2006.01) |
| *C23C 16/48* | (2006.01) |
| *C23C 16/52* | (2006.01) |

(52) U.S. Cl.

CPC .......... *H01J 37/304* (2013.01); *C23C 14/221* (2013.01); *C23C 16/047* (2013.01); *C23C 16/486* (2013.01); *C23C 16/52* (2013.01); *H01J 37/3178* (2013.01); *H01J 2237/31732* (2013.01); *H01J 2237/31749* (2013.01)

(58) Field of Classification Search

CPC ... H01J 37/304; H01J 37/3178; C23C 16/047; C23C 16/486; C23C 16/52; C23C 14/22; C23C 14/221

See application file for complete search history.

(56) References Cited

U.S. PATENT DOCUMENTS

| | | | |
|---|---|---|---|
| 8,253,118 B2 * | 8/2012 | Zhang ................ | H01J 37/3005 250/397 |
| 2001/0045525 A1 | 11/2001 | Gerlach et al. | |
| 2008/0185517 A1 | 8/2008 | Frosien | |

FOREIGN PATENT DOCUMENTS

| | | |
|---|---|---|
| JP | 3289133 A | 12/1991 |
| JP | 2007134520 A | 5/2007 |

OTHER PUBLICATIONS

Extended European Search Report re EP 15196604.1 dated May 3, 2016.

* cited by examiner

*Primary Examiner* — John Brayton

(74) *Attorney, Agent, or Firm* — The Webb Law Firm

(57) ABSTRACT

A deposition method is implemented in a focused ion beam system that supplies a compound gas to a specimen, and applies an ion beam to the specimen to deposit a deposition film, the deposition method including: a first deposition film-depositing step that deposits a first deposition film on the specimen using the ion beam that is defocused with respect to the specimen; and a second deposition film-depositing step that deposits a second deposition film on the first deposition film using the ion beam that is smaller in defocus amount than that used in the first deposition film-depositing step.

8 Claims, 8 Drawing Sheets

DEPOSITION METHOD AND FOCUSED ION BEAM SYSTEM

Japanese Patent Application No. 2014-244674 filed on Dec. 3, 2014, is hereby incorporated by reference in its entirety.

BACKGROUND OF THE INVENTION

The present invention relates to a deposition method and a focused ion beam system.

A focused ion beam system (FIB system) is a system which sputters the atoms that form the top surface of a specimen by scanning the surface of the specimen with a focused ion beam to etch an arbitrary minuscule area of the specimen. The focused ion beam system can also implement a deposition process that applies an ion beam to the specimen while blowing a compound gas on the area near the surface of the specimen to effect a chemical change in the area in which the ion beam is applied to deposit a film (see JP-A-3-289133 and JP-A-2007-134520, for example).

When the ion beam is applied to the area of the surface of the specimen which is filled with the compound gas, the ion beam collides with the compound gas molecules, and the gas molecules are decomposed. The decomposed gas molecules are adsorbed and deposited on the surface of the specimen. It is possible to deposit a film in an arbitrary area of the surface of the specimen by designating the target scanning range of the ion beam on the surface of the specimen in advance.

FIG. 14 is a view illustrating a deposition process (deposition operation) performed by a related-art focused ion beam system 101.

The focused ion beam system 101 opens a valve provided to a gas outlet of a gas gun 140, and inserts the gas gun 140 up to the upper portion near the surface of a specimen S that is supported by a specimen stage 120.

The focused ion beam system 101 focuses (just-focuses) the ion beam on the deposition target area of the surface of the specimen S using a focused ion beam optical system 110 and scans the deposition target area with the ion beam that is just-focused on the deposition target area. The gas molecules are thus decomposed and deposited on the surface of the specimen S in the area in which the surface of the specimen S is scanned with the ion beam.

After the focused ion beam system 101 has performed the deposition process for an arbitrary time, the focused ion beam system 101 stops scanning the surface of the specimen S with the ion beam. The focused ion beam system 101 then moves the gas gun 140 away from the surface of the specimen S, and closes the valve provided to the gas outlet of the gas gun 140.

A deposition film can be deposited by performing the above steps.

Since the focused ion beam system processes a minuscule area of the specimen, high processing accuracy is required, and the area near the top surface of the specimen is normally observed. A deposition film that is deposited using the focused ion beam system is used as a film that protects the top surface of the specimen during the FIB process (etching process).

Therefore, it is ideal to deposit a deposition film so as not to damage the surface of the specimen. However, since the deposition process utilizes an ion beam that is originally used for etching, the surface of the specimen may be scraped if a gas does not sufficiently fill the area near the surface of the specimen.

In the focused ion beam system, the specimen chamber is always maintained in a vacuum state during processing and deposition, and a gas is normally blown on the area near the surface of the specimen immediately before deposition, so that the gas locally fills the area near the surface of the specimen. Therefore, the surface of the specimen may be scraped by the ion beam in the initial stage of the deposition process due to lack of the gas. In such a case, a deposition film is deposited on the surface of the specimen that has been damaged from scraping by the ion beam.

In recent years, science and technology have remarkably developed, and various products have been reduced in size, integrated, and reduced in thickness. Therefore, it has been desired to further reduce damage during deposition of a deposition film.

SUMMARY

One aspect of the invention may provide a deposition method that can reduce damage to a specimen. Another aspect of the invention may provide a focused ion beam system that can deposit a film while reducing damage to a specimen.

According to a first aspect of the invention, there is provided a deposition method that is implemented in a focused ion beam system that supplies a compound gas to a specimen, and applies an ion beam to the specimen to deposit a deposition film, the deposition method including:

a first deposition film-depositing step that deposits a first deposition film on the specimen using the ion beam that is defocused with respect to the specimen; and a second deposition film-depositing step that deposits a second deposition film on the first deposition film using the ion beam that is smaller in defocus amount than that used in the first deposition film-depositing step.

According to a second aspect of the invention, there is provided a focused ion beam system including:

a focused ion beam optical system that focuses an ion beam, and applies the focused ion beam to a specimen;

a gas supply section that supplies a compound gas to the specimen; and a control section that controls the focused ion beam optical system, the control section performing: a first process in which the ion beam that is defocused with respect to the specimen is applied to the specimen to which the compound gas is supplied, by controlling the focused ion beam optical system; a second process in which the ion beam that is smaller in defocus amount than that used during the first process is applied to the specimen to which the compound gas is supplied, by controlling the focused ion beam optical system.

Figure 1:
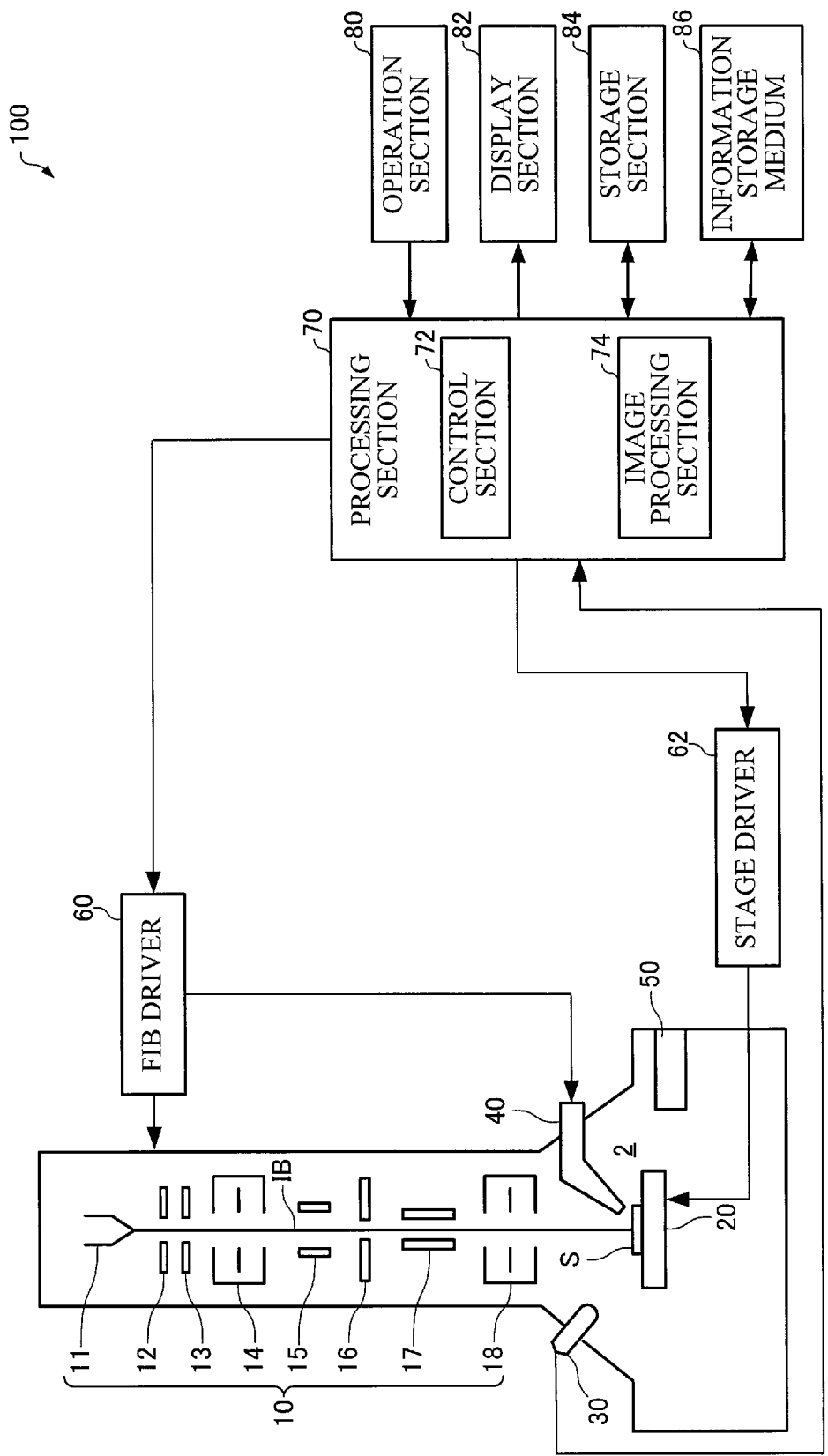
FIG. 1 is a view schematically illustrating the configuration of the focused ion beam system according to the first embodiment.

DETAILED DESCRIPTION OF THE EMBODIMENT (1) According to one embodiment of the invention, a deposition method is implemented in a focused ion beam system that supplies a compound gas to a specimen, and applies an ion beam to the specimen to deposit a deposition film, the deposition method including:

a first deposition film-depositing step that deposits a first deposition film on the specimen using the ion beam that is defocused with respect to the specimen; and a second deposition film-depositing step that deposits a second deposition film on the first deposition film using the ion beam that is smaller in defocus amount than that used in the first deposition film-depositing step.

According to the deposition method, even when the compound gas does not sufficiently fill the area near the specimen, a deposition film can be deposited while reducing damage to the specimen by utilizing the ion beam that is defocused with respect to the specimen. A thick deposition film can then be deposited within an arbitrarily designated range by utilizing the ion beam for which the defocus amount is decreased, for example. Therefore, the deposition method can reduce damage to the specimen, and deposit a deposition film having a good shape.

(2) In the deposition method, the first deposition film-depositing step may deposit the first deposition film while decreasing the defocus amount with the passing of time.

In this case, damage to the specimen can be reduced.

(3) In the deposition method, the first deposition film-depositing step may deposit the first deposition film while linearly decreasing the defocus amount.

(4) In the deposition method, the first deposition film-depositing step may deposit the first deposition film while curvilinearly decreasing the defocus amount.

(5) According to another embodiment of the invention, a deposition method is implemented in a focused ion beam system that supplies a compound gas to a specimen, and applies an ion beam to the specimen to deposit a deposition film, the deposition method including:

a deposition film-depositing step that deposits the deposition film on the specimen while controlling the focus state of the ion beam based on the amount of the compound gas that is supplied to the specimen.

According to the deposition method, a low-dose ion beam (i.e., an ion beam that is defocused to a large extent with respect to the specimen) is used when the compound gas does not sufficiently fill the area near the specimen, and a high-dose ion beam (e.g., an ion beam that is just-focused on the specimen) is used when the compound gas sufficiently fills the area near the specimen when depositing a deposition film. Therefore, the deposition method can reduce damage to the specimen, and deposit a deposition film having a good shape.

(6) In the deposition method, the deposition film-depositing step may decrease the defocus amount of the ion beam with respect to the specimen when the amount of the compound gas that is supplied to the specimen increases.

(7) In the deposition method, the deposition film-depositing step may control the focus state of the ion beam based on the degree of vacuum inside a specimen chamber in which the specimen is placed.

(8) According to another embodiment of the invention, a focused ion beam system includes:

a focused ion beam optical system that focuses an ion beam, and applies the focused ion beam to a specimen;

a gas supply section that supplies a compound gas to the specimen; and a control section that controls the focused ion beam optical system, the control section performing: a first process in which the ion beam that is defocused with respect to the specimen is applied to the specimen to which the compound gas is supplied, by controlling the focused ion beam optical system; second process in which the ion beam that is smaller in defocus amount than that used during the first process is applied to the specimen to which the compound gas is supplied, by controlling the focused ion beam optical system.

According to the focused ion beam system, even when the compound gas does not sufficiently fill the area near the specimen, it is possible to deposit a deposition film while reducing damage to the specimen by utilizing the ion beam that is defocused with respect to the specimen. A thick deposition film can then be deposited within an arbitrarily designated range by utilizing the ion beam for which the defocus amount is decreased, for example. Therefore, the focused ion beam system can reduce damage to the specimen, and deposit a deposition film having a good shape.

(9) In the focused ion beam system, the first process may decrease the defocus amount with the passing of time by controlling the focused ion beam optical system.

(10) In the focused ion beam system, the first process may linearly decrease the defocus amount by controlling the focused ion beam optical system.

(11) In the focused ion beam system, the first process may curvilinearly decrease the defocus amount by controlling the focused ion beam optical system.

(12) According to another embodiment of the invention, a focused ion beam system includes:

a focused ion beam optical system that focuses an ion beam, and applies the focused ion beam to a specimen;

a gas supply section that supplies a compound gas to the specimen; and a control section that controls the focused ion beam optical system, the control section performing a process that applies the ion beam to the specimen while controlling the focus state of the ion beam based on the amount of the compound gas that is supplied to the specimen.

According to the focused ion beam system, a low-dose ion beam (i.e., an ion beam that is defocused to a large extent with respect to the specimen) is used when the compound gas does not sufficiently fill the area near the specimen, and a high-dose ion beam (e.g., an ion beam that is just-focused on the specimen) is used when the compound gas sufficiently fills the area near the specimen when depositing a deposition film. Therefore, the focused ion beam system can reduce damage to the specimen, and deposit a deposition film having a good shape.

(13) In the focused ion beam system, the control section may decrease the defocus amount of the ion beam when the amount of the compound gas that is supplied to the specimen increases.

(14) The focused ion beam system may further include a vacuum gauge that measures the degree of vacuum inside a specimen chamber in which the specimen is placed, and the control section may control the focus state of the ion beam based on the degree of vacuum inside the specimen chamber measured by the vacuum gauge.

Exemplary embodiments of the invention are described in detail below with reference to the drawings. Note that the following exemplary embodiments do not unduly limit the scope of the invention as stated in the claims. Note also that all of the elements described below should not necessarily be taken as essential elements of the invention.

1. First Embodiment 1.1. Focused Ion Beam System

A focused ion beam system according to a first embodiment is described below with reference to the drawings. FIG. 1 is a view schematically illustrating the configuration of a focused ion beam system 100 according to the first embodiment.

As illustrated in FIG. 1, the focused ion beam system 100 includes a focused ion beam optical system 10, a specimen stage 20, a secondary electron detector 30, a gas gun 40 (i.e., gas supply section), a vacuum gauge 50, an FIB driver 60, a stage driver 62, a processing section 70, an operation section 80, a display section 82, a storage section 84, and an information storage medium 86.

The focused ion beam optical system 10 includes an ion source 11, an extracting electrode 12, an accelerating electrode 13, a condenser lens 14, a beam blanking electrode 15, a variable multi-aperture 16, a beam deflection electrode 17, and an objective lens 18.

The ion source 11 generates an ion beam IB. The extracting electrode 12 is an electrode for extracting ions from the ion source 11. The accelerating electrode 13 is an electrode that accelerates the ions extracted from the ion source 11 via the extracting electrode 12.

The ion source 11, the extracting electrode 12, and the accelerating electrode 13 form an ion gun that generates the ion beam IB. The ion gun is configured so that the ions extracted from the ion source 11 via the extracting electrode 12 are accelerated by the accelerating electrode 13 to emit the ion beam IB that is accelerated by a given accelerating voltage.

The condenser lens 14 focuses the ion beam IB generated by the ion source 11 (ion gun). An electrostatic lens is used as the condenser lens 14, for example.

The beam blanking electrode 15 enables or disables the application of the ion beam IB focused by the condenser lens 14 to a specimen S.

The variable multi-aperture 16 selectively limits the current of the ion beam IB for which the application is enabled by the beam blanking electrode 15. The variable multi-aperture 16 has a plurality of aperture holes that differ in diameter, and selectively limits the current of the ion beam IB by switching the aperture hole situated on the path of the ion beam IB.

The beam deflection electrode 17 deflects the ion beam IB for which the current is selectively limited by the variable multi-aperture 16. It is possible to two-dimensionally scan the specimen S with the ion beam IB by deflecting the ion beam IB using the beam deflection electrode 17.

The objective lens 18 is a lens that focuses the ion beam IB on the specimen S. An electrostatic lens is used as the objective lens 18, for example.

The specimen stage 20 supports the specimen S. The specimen stage 20 can two-dimensionally move the specimen S in the horizontal direction (XY direction). The specimen stage 20 can also rotate or tilt the specimen S.

The secondary electron detector 30 detects secondary electrons generated by the specimen S when the ion beam IB has been applied to the specimen S. The secondary electron detector 30 includes a scintillator and a photomultiplier, for example. A secondary electron detection signal (intensity signal) detected by the secondary electron detector 30 is transmitted to the processing section 70 as image data that is synchronized with a scan signal for the ion beam IB, for example. The secondary electron detection signal is processed by an image processing section 74, and displayed on the display section 82. A scanning ion microscope image (SIM image) can thus be observed.

The gas gun 40 supplies a compound gas to the surface of the specimen S. When the ion beam IB is applied to the surface of the specimen S where the compound gas is filled, the ion beam IB collides with the compound gas molecules, and the gas molecules are decomposed. The decomposed gas molecules are adsorbed and deposited on the surface of the specimen S. A deposition film is thus formed. For example, when $W(CO)_6$ is used as the compound gas, a tungsten film is deposited (formed) on the surface of the specimen S in the area scanned with the ion beam IB.

The vacuum gauge 50 measures the degree of vacuum (pressure) inside a specimen chamber 2.

The FIB driver 60 drives the focused ion beam optical system 10 and the gas gun 40. The FIB driver 60 is controlled by a control section 72.

The stage driver 62 drives the specimen stage 20. The stage driver 62 is controlled by the control section 72.

The operation section 80 acquires an operation signal that corresponds to the operation performed by the user, and transmits the operation signal to the processing section 70. The operation section 80 is a button, a key, a touch panel display, or a microphone, for example.

The display section 82 displays an image generated by the processing section 70 (image processing section 74). The function of the display section 82 may be implemented by an LCD, a CRT, or the like. The display section 82 displays the SIM image, for example.

The storage section 84 serves as a work area for the processing section 70. The function of the storage section 84 may be implemented by a RAM or the like. The storage section 84 stores a program, data, and the like that cause or allow the processing section 70 to perform various control processes and calculation processes. The storage section 84 is also used to temporarily store the results of calculations performed by the processing section 70 according to a program, for example. The storage section 84 stores information about the focus conditions, the deposition time, and the like used for the deposition process described later, for example.

The information storage medium 86 (computer-readable medium) stores a program, data, and the like. The function of the information storage medium 86 may be implemented by an optical disk (CD or DVD), a magneto-optical disk (MO), a magnetic disk, a hard disk, a magnetic tape, a memory (ROM), or the like. The processing section 70 performs various processes according to the first embodiment based on the program (data) stored in the information storage medium 86. The information storage medium 86 may store a program that causes a computer to function as each section of the processing section 70.

The processing section 70 performs various control processes and calculation processes according to the program stored in the information storage medium 86. The processing section 70 functions as the control section 72 and the image processing section 74 (described below) by executing the program stored in the information storage medium 86. The function of the processing section 70 may be implemented by hardware such as a processor (e.g., CPU or DSP) or an ASIC (e.g., gate array), or a program. Note that at least part of the processing section 70 may be implemented by hardware (dedicated circuit). The processing section 70 includes the control section 72 and the image processing section 74.

The control section 72 controls the focused ion beam optical system 10, the gas gun 40, and the specimen stage 20 through the FIB driver 60 and the stage driver 62. The control section 72 performs the deposition process that deposits a deposition film on the specimen S by controlling the focused ion beam optical system 10. The details of the deposition process are described later (see "1.2. Deposition method").

The image processing section 74 performs a process that receives the detection signal from the secondary electron detector 30 as image data that is synchronized with the scan signal for the ion beam IB, and generates an SIM image. The image processing section 74 displays the generated SIM image on the display section 82.

The focused ion beam system 100 can etch the specimen S (in an area scanned with the ion beam IB) by scanning the specimen S with the ion beam IB using the focused ion beam optical system 10. The focused ion beam system 100 can deposit a deposition film on the specimen S (in an area scanned with the ion beam IB) by supplying the compound gas to the specimen S using the gas gun 40, and scanning the specimen S with the ion beam IB using the focused ion beam optical system 10.

1.2. Deposition Method

Figure 2:
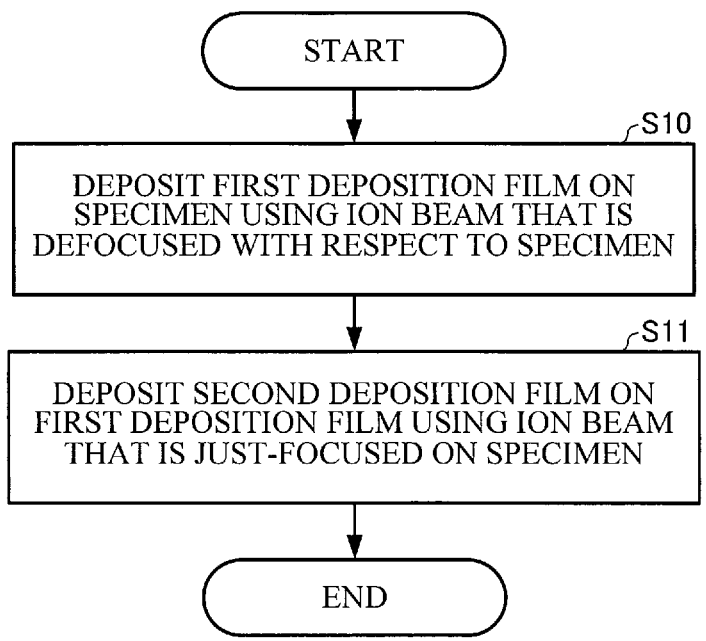
FIG. 2 is a flowchart illustrating an example of a deposition method that is implemented in the focused ion beam system according to the first embodiment.
Figure 3:
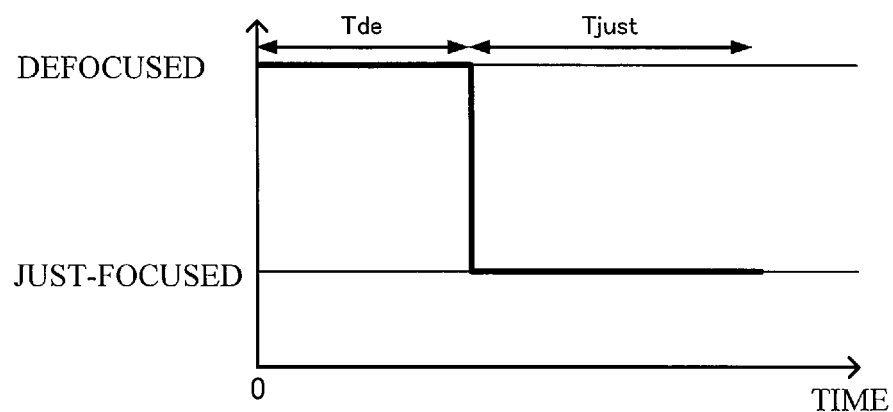
FIG. 3 is a view illustrating an example of a focus control process performed by the control section in the focused ion beam system according to the first embodiment.
Figure 4A:
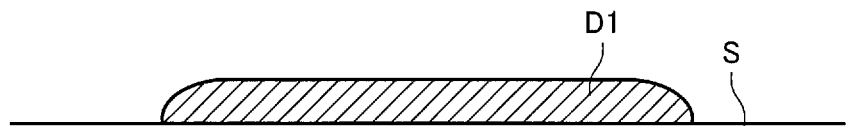
FIGS. 4A and 4B are cross-sectional views schematically illustrating a deposition step that is performed using the focused ion beam system according to the first embodiment.
Figure 4B:
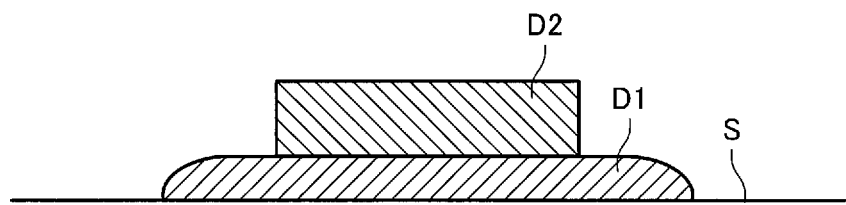

A method for depositing a deposition film that is implemented in the focused ion beam system 100 according to the first embodiment is described below with reference to the drawings. FIG. 2 is a flowchart illustrating an example of the deposition method that is implemented in the focused ion beam system 100 according to the first embodiment. FIG. 3 is a view illustrating an example of a focus control process performed by the control section 72. FIGS. 4A and 4B are cross-sectional views schematically illustrating a deposition step that deposits a deposition film D.

For example, when the user designates an arbitrary area (deposition area) of the specimen S, and instructs the control section 72 to start the deposition process through the operation section 80, the control section 72 receives the operation signal from the operation section 80, and starts the deposition process. The compound gas is then supplied to the specimen S from the gas outlet of the gas gun 40.

As illustrated in FIG. 4A, a first deposition film D1 is deposited on the specimen S using the ion beam IB that is defocused with respect to the specimen S (step S10).

Specifically, the control section 72 performs a process that applies the ion beam IB that is defocused with respect to the specimen S to the specimen S to which the compound gas is supplied by controlling the focused ion beam optical system 10.

The control section 72 defocuses the ion beam IB emitted from the ion source 11 with respect to the specimen S by controlling the objective lens 18, and scans the deposition area of the specimen S with the defocused ion beam IB for a time Tde by controlling the beam deflection electrode 17. The first deposition film is thus deposited on the specimen S (see FIGS. 4A and 4B).

Note that the control section 72 may defocus the ion beam IB with respect to the specimen S in an over-focus state or an under-focus state. When the ion beam IB is defocused with respect to the specimen S in an under-focus state, it is possible to deposit a deposition film having a clear edge (i.e., the boundary between the deposition area and the non-deposition area) as compared with the case where the ion beam IB is defocused with respect to the specimen S in an over-focus state even when the defocus amount is identical.

The defocus amount used in the step S10 may be set arbitrarily. For example, the defocus amount is increased when the specimen S is easily damaged by the ion beam IB.

As illustrated in FIG. 4B, a second deposition film D2 is deposited on the first deposition film D1 using the ion beam IB that is just-focused on the specimen S (step S11).

Specifically, the control section 72 performs a process that applies the ion beam IB that is just-focused on the specimen S to the specimen S (deposition area) to which the compound gas is supplied by controlling the focused ion beam optical system 10.

The control section 72 momentarily switches the focus state of the ion beam IB with respect to the specimen S from the defocus state to the just-focus state by controlling the objective lens 18, and scans the deposition area of the specimen S with the just-focused ion beam IB for a time Tjust by controlling the beam deflection electrode 17. In the step S11, the control section 72 changes only the focus state by controlling the objective lens 18, and the process (e.g., the process that controls the beam deflection electrode 17) other than the process that changes the focus state is performed in the same manner as in the step S10.

When the control section 72 has scanned the deposition area of the specimen S with the just-focused ion beam IB for the time Tjust, the control section 72 terminates the deposition process. The second deposition film D2 is thus deposited on the first deposition film D1.

The time (deposition time Tdepo) in which the deposition film is deposited is represented by the sum of the defocus time Tde and the just-focus time Tjust (Tdepo=Tde+Tjust). The ratio of the defocus time Tde to the just-focus time Tjust may be set arbitrarily. Alternatively, the defocus time Tde may be set arbitrarily.

For example, information about the ratio of the defocus time Tde to the just-focus time Tjust (or information about the defocus time Tde), information about the defocus amount used in the step S10, and the like may be stored in the storage section 84 in advance. The control section 72 may read the information from the storage section 84, and perform the above process (steps S10 and S11) according to the information read from the storage section 84. In this case, the focused ion beam system 100 can automatically deposit the deposition film.

The focused ion beam system 100 has the following features, for example.

The focused ion beam system 100 is configured so that the control section 72 performs the process (step S10) that applies the ion beam IB that is defocused with respect to the specimen S to the specimen S to which the compound gas is supplied by controlling the focused ion beam optical system 10, and performs the process (step S11) that applies the ion beam IB that is just-focused on the specimen S to the specimen S to which the compound gas is supplied by controlling the focused ion beam optical system 10. Therefore, even when the gas does not sufficiently fill the area near the specimen S, the focused ion beam system 100 can deposit a deposition film while reducing damage to the top surface of the specimen S by utilizing the ion beam IB that is defocused with respect to the specimen, since the ion beam B3 is diffused as compared with the case where the ion beam IB is just-focused on the specimen S. A thick deposition film can then be deposited within an arbitrarily designated range by utilizing the ion beam IB that is just-focused on the specimen S. Therefore, the focused ion beam system 100 can reduce damage to the surface of the specimen S, and deposit a deposition film having a good shape.

The deposition method according to the first embodiment includes the step (step S10) that deposits the first deposition film on the specimen S using the ion beam IB that is defocused with respect to the specimen S, and the step (step S11) that deposits the second deposition film on the first deposition film using the ion beam IB that is just-focused on the specimen S. Therefore, the deposition method according to the first embodiment can reduce damage to the surface of the specimen S, and deposit a deposition film having a good shape.

Figure 5A:
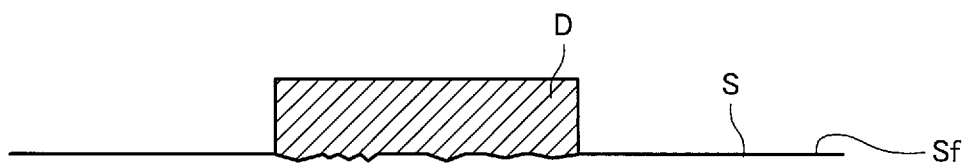
FIG. 5A is a cross-sectional view schematically illustrating a deposition film that is deposited by scanning the surface of a specimen with an ion beam that is just-focused.
Figure 5B:
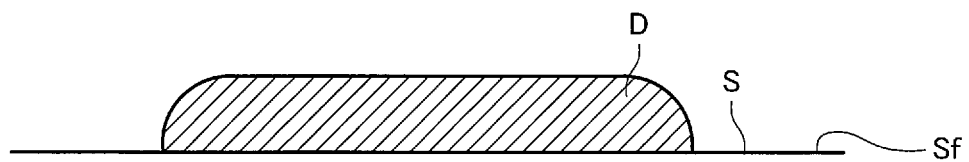
FIG. 5B is a cross-sectional view schematically illustrating a deposition film that is deposited by scanning the surface of a specimen with an ion beam that is defocused.

FIG. 5A is a cross-sectional view schematically illustrating a deposition film D that is deposited by scanning the surface Sf of the specimen S with the ion beam IB that is just-focused on the specimen S, and FIG. 5B is a cross-sectional view schematically illustrating a deposition film D that is deposited by scanning the surface Sf of the specimen S with the ion beam IB that is defocused with respect to the specimen S.

When the deposition process is performed using the ion beam IB that is just-focused on the specimen S, the surface Sf of the specimen S is damaged, but the deposition film D has a good shape (see FIG. 5A). When the deposition process is performed using the ion beam IB that is defocused with respect to the specimen S, the surface Sf of the specimen S is not damaged (is damaged to only a small extent) that is, the surface Sf of the specimen S is protected, since the dose decreases as compared with the ion beam IB that is just-focused on the specimen S (see FIG. 5B). Note that the edge (contour) of the deposition film D is rounded when the deposition process is performed using the ion beam IB that is defocused with respect to the specimen S.

It is possible to reduce damage to the specimen S, and deposit a deposition film D having a good shape by depositing the deposition film D1 using the ion beam IB that is defocused with respect to the specimen S (see FIG. 4A), and then depositing the deposition film D2 on the deposition film D1 using the ion beam IB that is just-focused on the specimen S (see FIG. 4B).

Therefore, the focused ion beam system 100 can be selectively used taking account of the application, such as increasing the defocus time Tde when the deposition film need not have a good shape (e.g., when preparing a transmission electron microscope specimen by removing each end of the deposition film and reducing the thickness of the deposition film to 100 nm or less), and increasing the just-focus time Tjust when the deposition film must have a good shape (e.g., when processing a wire of a semiconductor device). This makes it possible to more advantageously prepare a specimen.

The focused ion beam system 100 deposits a deposition film while controlling the dose of the ion beam IB by controlling the focus state of the ion beam IB. For example, when the dose of the ion beam IB is controlled by selectively limiting the current of the ion beam IB using the variable multi-aperture 16, it is necessary to change the diameter of the aperture. However, the deposition process must be suspended when changing the diameter of the aperture. Therefore, it is impossible to momentarily change the dose (see FIG. 3) or continuously change the dose (see FIGS. 8 and 9). Since the focused ion beam system 100 controls the dose of the ion beam IB by controlling the focus state of the ion beam IB, the dose of the ion beam IB can be controlled without suspending the deposition process, and a deposition film can be efficiently deposited while reducing damage to the specimen S.

1.3. Modifications

Modifications of the focused ion beam system according to the first embodiment are described below. Note that the following description focuses on the differences between the focused ion beam system according to each modification and the focused ion beam system 100 illustrated in FIG. 1, and description of the same features is omitted.

(1) First Modification

Figure 6:
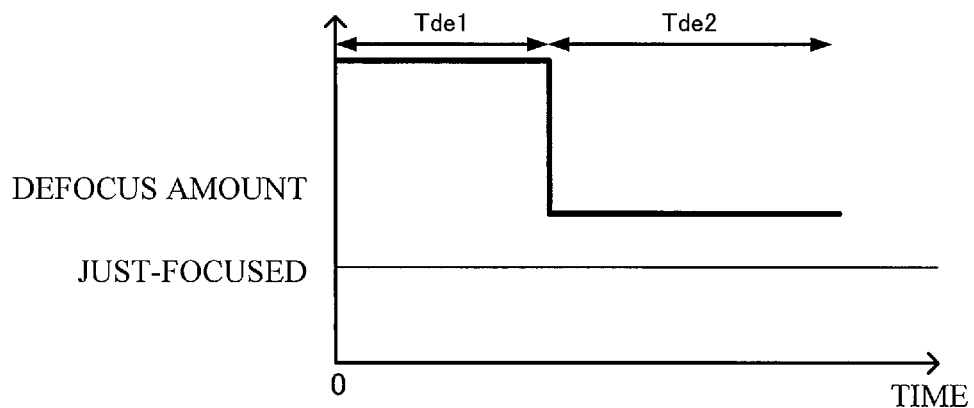
FIG. 6 is a view illustrating an example of a focus control process performed by the control section in the focused ion beam system according to the first modification.

A first modification is described below. FIG. 6 is a view schematically illustrating an example of a focus control process performed by a control section 72 in a focused ion beam system according to the first modification. Note that the focused ion beam system according to the first modification is configured in the same manner as the focused ion beam system illustrated in FIG. 1, and illustration thereof is omitted.

The control section 72 in the focused ion beam system 100 deposits a deposition film by performing the process that applies the ion beam IB that is defocused with respect to the specimen S to the specimen S by controlling the focused ion beam optical system 10, and performing the process that applies the ion beam IB that is just-focused on the specimen S to the specimen S by controlling the focused ion beam optical system 10 (see FIG. 3).

The focused ion beam system according to the first modification is configured so that the control section 72 deposits a deposition film by performing a first process that applies the ion beam IB that is defocused with respect to the specimen S to the specimen S by controlling the focused ion beam optical system 10, and performing a second process that applies the ion beam IB that is smaller in defocus amount than that used during the first process to the specimen S to which the compound gas is supplied by controlling the focused ion beam optical system 10 (see FIG. 6).

Note that being smaller in defocus amount than that used during the first process in connection with the ion beam IB used for the second process means that the ion beam IB used for the second process is smaller in the absolute value of the defocus amount than that used during the first process. For example, the ion beam IB may be defocused with respect to the specimen S in an under-focus state during the first process, and may be defocused with respect to the specimen S in an over-focus state during the second process, and vice versa. The ion beam IB may be defocused with respect to the specimen S in an under-focus state (or an over-focus state) during the first process, and may be just-focused on the specimen S during the second process.

Figure 7:
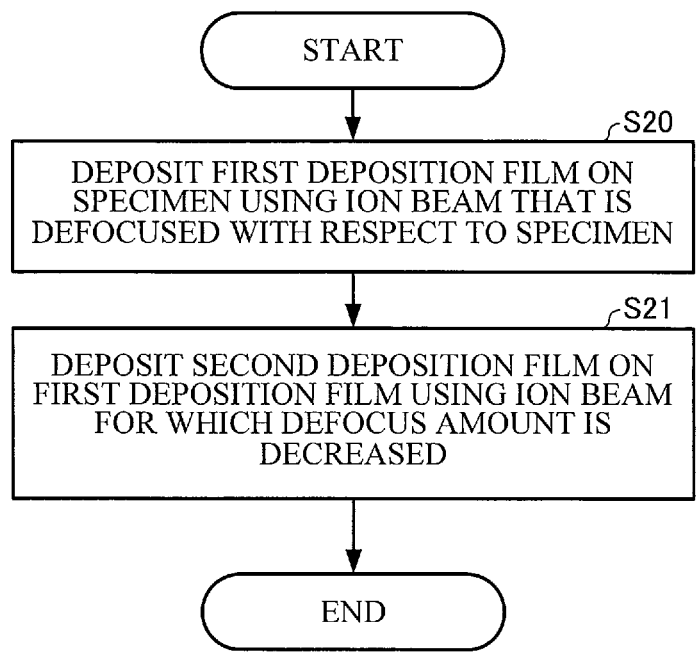
FIG. 7 is a flowchart illustrating an example of a deposition method that is implemented in the focused ion beam system according to the first modification.

A method for depositing a deposition film that is implemented in the focused ion beam system according to the first modification is described below with reference to FIG. 7. FIG. 7 is a flowchart illustrating an example of the deposition method that is implemented using the focused ion beam system according to the first modification.

A first deposition film is deposited on the specimen S using the ion beam IB that is defocused with respect to the specimen S (step S20).

Specifically, the control section 72 performs a process in which the ion beam IB that is defocused with respect to the specimen S is applied to the specimen S to which the compound gas is supplied for a time Tde1, by controlling the focused ion beam optical system 10.

The control section 72 deposits a second deposition film on the first deposition film using the ion beam IB that is smaller in defocus amount than that used during the step S20 (step S21).

Specifically, the control section 72 performs a process in which the ion beam IB that is smaller in defocus amount than that used during the step S20 is applied to the specimen S to which the compound gas is supplied for a time Tde2, by controlling the focused ion beam optical system 10. The control section 72 then terminates the deposition process.

The focused ion beam system and the deposition method according to the first modification can achieve the same advantageous effects as those achieved by the focused ion beam system and the deposition method according to the first embodiment.

(2) Second Modification

Figure 8:
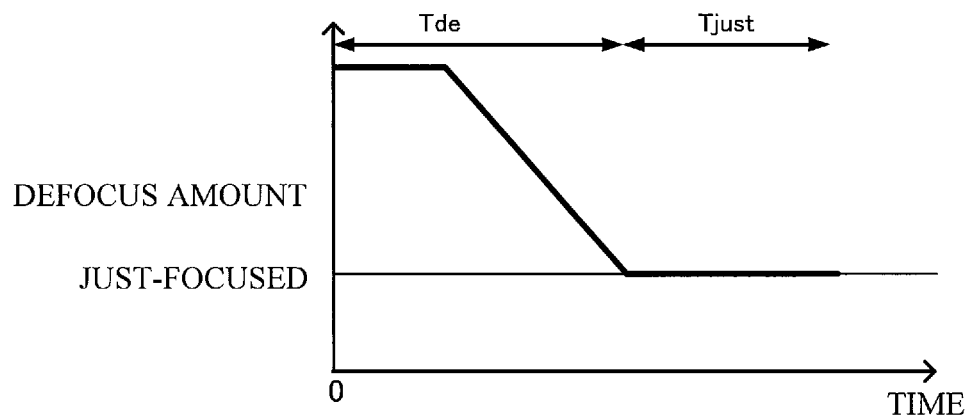
FIG. 8 is a view illustrating an example of a focus control process performed by the control section in the focused ion beam system according to the second modification.

A second modification is described below. FIG. 8 is a view illustrating an example of a focus control process performed by a control section 72 in a focused ion beam system according to the second modification. Note that the focused ion beam system according to the second modification is configured in the same manner as the focused ion beam system illustrated in FIG. 1, and illustration thereof is omitted.

The focused ion beam system 100 is configured so that the control section 72 momentarily switches the focus state of the ion beam IB with respect to the specimen S from the defocus state to the just-focus state (see FIG. 3).

The focused ion beam system according to the second modification is configured so that the control section 72 performs a process that decreases the defocus amount with the passing of time when applying the ion beam IB that is defocused with respect to the specimen S to the specimen S by controlling the focused ion beam optical system 10 (see FIG. 8).

FIG. 8 illustrates an example in which the control section 72 maintains the defocus amount at a constant value for a given time, and then linearly decreases the defocus amount with the passing of time when the ion beam B3 that is defocused with respect to the specimen S is applied to the specimen S. The control section 72 then decreases the defocus amount to zero (i.e., sets the focus state of the ion beam IB to the just-focus state).

Figure 9:
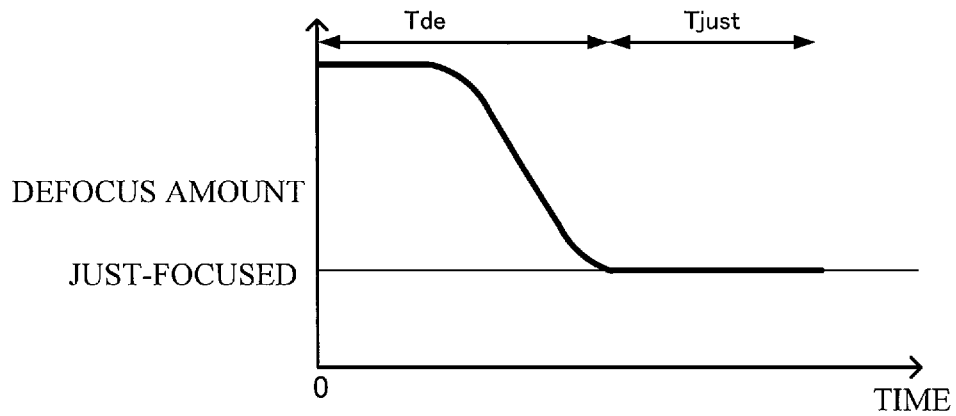
FIG. 9 is a view illustrating an example of a focus control process performed by the control section in the focused ion beam system according to the second modification.

As shown in FIG. 9, note that the control section 72 may decrease the defocus amount curvilinearly (i.e., so as to form an S-shaped curve) when the ion beam IB that is defocused with respect to the specimen S is applied to the specimen S.

The focused ion beam system and the deposition method according to the second modification can achieve the same advantageous effects as those achieved by the focused ion beam system and the deposition method according to the first embodiment.

2. Second Embodiment 2.1. Focused Ion Beam System

Figure 10:
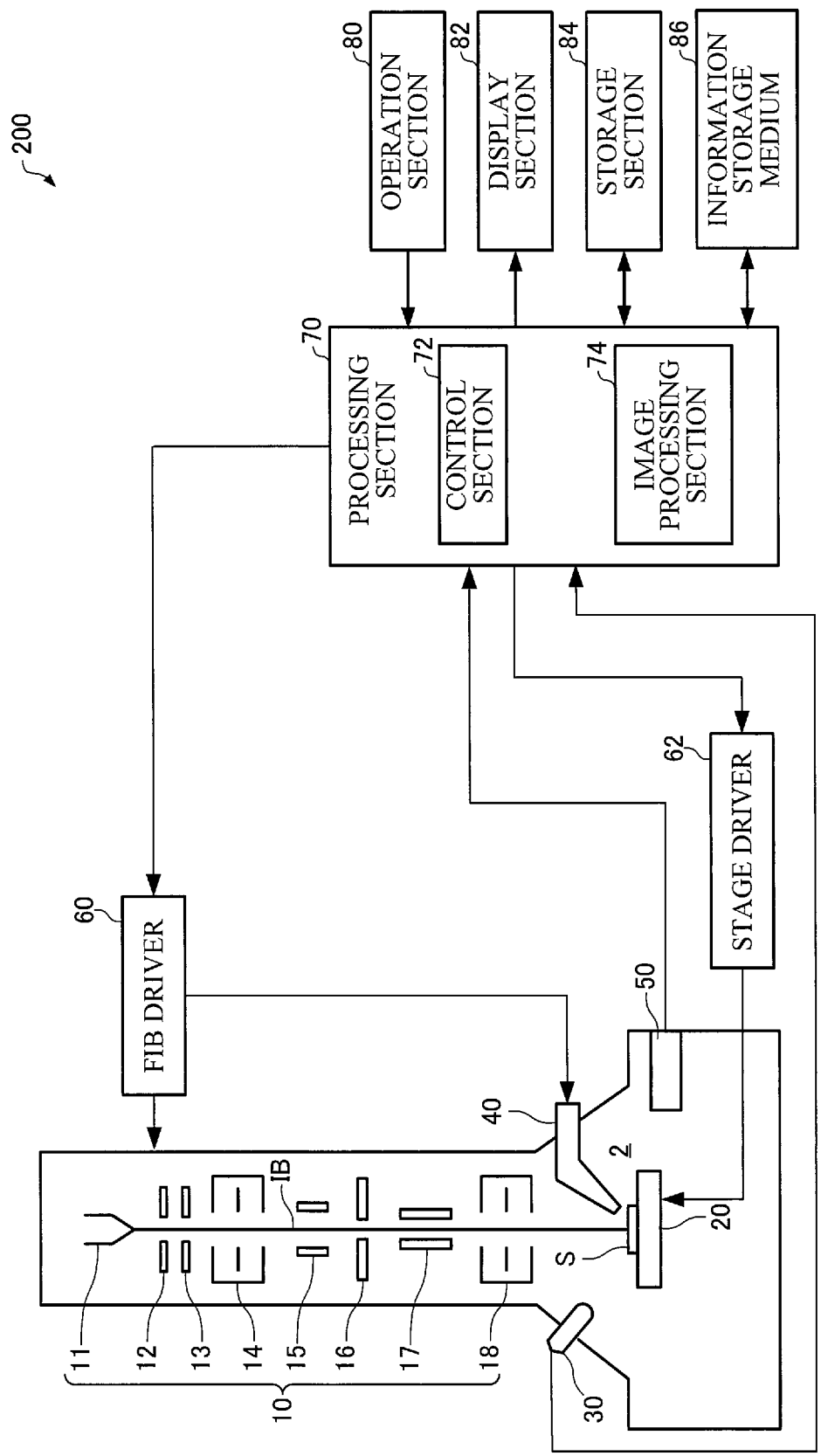
FIG. 10 is a view schematically illustrating the configuration of the focused ion beam system according to the second embodiment.

A focused ion beam system according to a second embodiment is described below with reference to the drawings. FIG. 10 is a view schematically illustrating the configuration of a focused ion beam system 200 according to the second embodiment. Note that the members of the focused ion beam system 200 according to the second embodiment that are identical in function to those of the focused ion beam system 100 according to the first embodiment are indicated by the same reference signs (symbols), and detailed description thereof is omitted.

The focused ion beam system 200 is configured so that the control section 72 performs a process that controls the focus state of the ion beam IB based on the amount of the compound gas that is supplied to the specimen S from the gas gun 40, and applies the ion beam IB to the specimen S.

Specifically, the control section 72 performs a process that decreases the defocus amount corresponding to an increase in the amount of the compound gas supplied to the specimen S, when the amount of the compound gas supplied to the specimen S increases. The control section 72 may perform a process that increases the defocus amount corresponding to a decrease in the amount of the compound gas supplied to the specimen S, when the amount of the compound gas supplied to the specimen S decreases.

In the example illustrated in FIG. 10, the control section 72 controls the focus state of the ion beam IB by controlling the focused ion beam optical system 10 based on the measurement results of the vacuum gauge 50 that measures the degree of vacuum (pressure) inside the specimen chamber 2. The degree of vacuum inside the specimen chamber 2 corresponds to the amount of the compound gas supplied to the specimen S.

For example, information about the relationship between the amount of the compound gas (i.e., the degree of vacuum inside the specimen chamber 2) and the defocus amount is stored in the storage section 84. The control section 72 reads the information about the relationship between the amount of the compound gas and the defocus amount from the storage section 84, determines the defocus amount from the amount of the compound gas (i.e., the degree of vacuum inside the specimen chamber 2), and controls the focus state of the ion beam IB.

Note that the control section 72 may control the focus state of the ion beam IB by controlling the focused ion beam optical system 10 based on the opening of a gas supply control valve that controls the amount of the compound gas supplied from the gas gun 40. The opening of the gas supply control valve corresponds to the amount of the compound gas supplied to the specimen S.

2.2. Deposition Method

Figure 11:
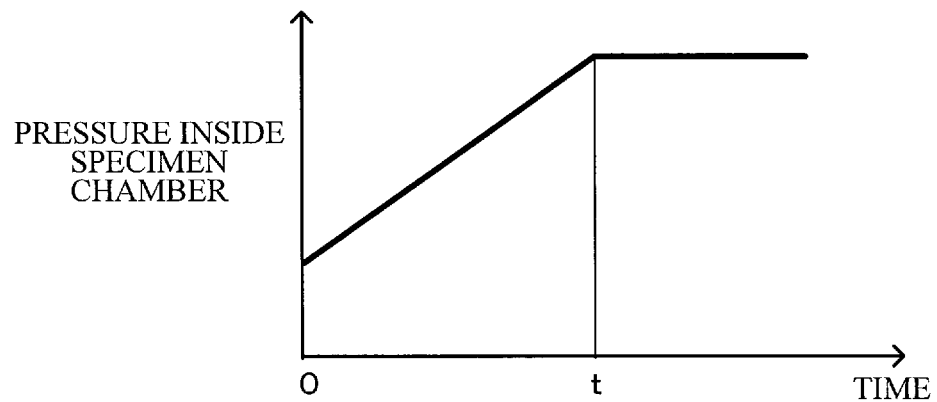
FIG. 11 is a graph illustrating an example of a change in the degree of vacuum inside a specimen chamber.
Figure 12:
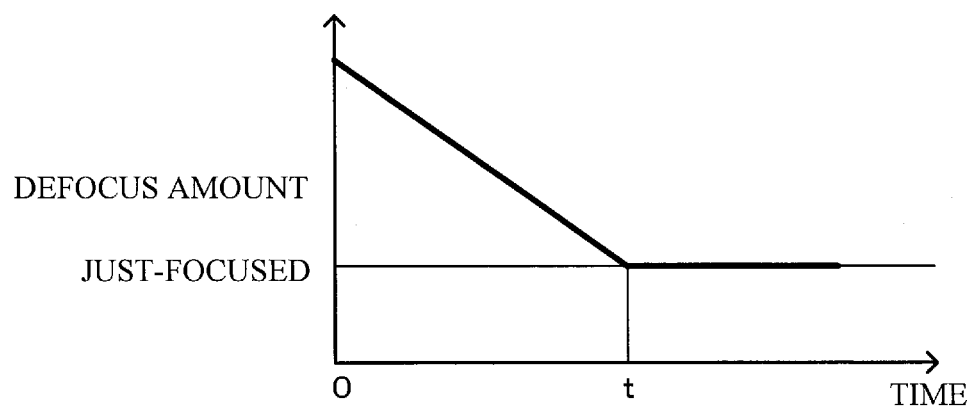
FIG. 12 is a view illustrating an example of a focus control process performed by the control section in the focused ion beam system according to the second embodiment.

A method for depositing a deposition film that is implemented in the focused ion beam system 200 according to the second embodiment is described below with reference to the drawings. FIG. 11 is a graph illustrating an example of a change in the degree of vacuum inside the specimen chamber 2. FIG. 12 is a view illustrating an example of a focus control process performed by the control section 72 in the focused ion beam system 200.

The following description focuses on the differences between the deposition method that is implemented in the focused ion beam system 200 according to the second embodiment and the deposition method that is implemented in the focused ion beam system 100 according to the first embodiment, and the description of the same features is omitted.

For example, when the user designates an arbitrary area (deposition area) of the specimen S, and instructs the control section 72 to start the deposition process through the operation section 80, the control section 72 receives the operation signal from the operation section 80, and starts the deposition process. The compound gas is then supplied to the specimen S from the gas outlet of the gas gun 40.

The focus state of the ion beam IB is controlled based on the amount of the compound gas supplied to the specimen S to deposit a deposition film on the specimen S.

Specifically, the processing section 70 receives an output signal (i.e., measurement result information) from the vacuum gauge 50, and the control section 72 applies the ion beam IB to the specimen S while controlling the focus state of the ion beam IB based on the degree of vacuum inside the specimen chamber 2 that has been measured by the vacuum gauge 50.

For example, when the compound gas is supplied to the specimen S from the gas gun 40, the pressure inside the specimen chamber 2 gradually increases with the passing of time (see FIG. 11), and the control section 72 controls the focused ion beam optical system 10 so that the defocus amount decreases as the pressure inside the specimen chamber 2 increases (see FIG. 12). When the pressure inside the specimen chamber 2 becomes constant at a time t, the control section 72 controls the focused ion beam optical system 10 so that the focus state of the ion beam IB becomes constant (in the just-focus state in the example illustrated in FIG. 12). When the control section 72 has performed the above process for a preset time, the control section 72 terminates the deposition process.

The focused ion beam system 200 is configured so that the control section 72 controls the focus state of the ion beam IB based on the amount of the compound gas supplied to the specimen S, and applies the ion beam IB to the specimen S. Therefore, the focused ion beam system 200 uses the low-dose ion beam IB (i.e., an ion beam that is defocused to a large extent with respect to the specimen S) when the gas does not sufficiently fill the area near the specimen S, and uses the high-dose ion beam IB (e.g., an ion beam that is just-focused on the specimen S) when the gas sufficiently fills the area near the specimen S. Therefore, the focused ion beam system 200 can reduce damage to the surface of the specimen S, and deposit a deposition film having a good shape.

The deposition method according to the second embodiment includes a step that deposits a deposition film on the specimen S while controlling the focus state of the ion beam IB based on the amount of the compound gas supplied to the specimen S. Therefore, the deposition method according to the second embodiment can reduce damage to the surface of the specimen S, and deposit a deposition film having a good shape.

3. Additional Embodiments

The invention is not limited to the above embodiments. Various modifications and variations may be made without departing from the scope of the invention.

The focused ion beam system 100 according to the first embodiment illustrated in FIG. 1 has been described above taking an example in which the control section 72 deposits a deposition film while controlling the focus state (see FIG. 3) by controlling the focused ion beam optical system 10. Note that the user may control the focus state (see FIG. 3) by controlling the focused ion beam optical system 10 through the operation section 80 and the control section 72 to deposit a deposition film.

When implementing the second embodiment, the user may control the focus state by controlling the focused ion beam optical system 10 through the operation section 80 and the control section 72, while checking the measurement results of the vacuum gauge 50 to deposit a deposition film.

Figure 13:
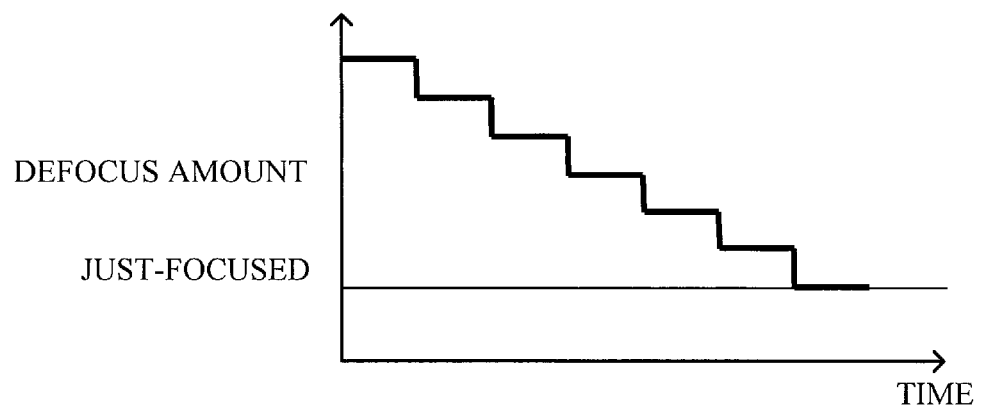
FIG. 13 is a view illustrating an example of a focus control process performed by the control section in the focused ion beam system according to the additional embodiment.
Figure 14:
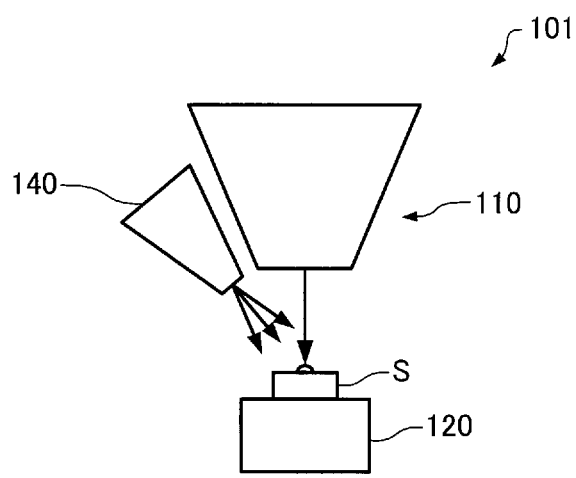
FIG. 14 is a view illustrating a deposition process (deposition operation) performed by a related-art focused ion beam system.

Although the first embodiment has been described above taking an example in which the focus state of the ion beam IB is momentarily switched from the defocus state to the just-focus state (see FIG. 3), the control section 72 may repeat a process in which the ion beam IB that is defocused with respect to the specimen S is applied to the specimen S, by controlling the focused ion beam optical system 10, and a process in which the ion beam IB that is smaller in defocus amount is applied to the specimen S, by controlling the focused ion beam optical system 10 (see FIG. 13).

Specifically, the control section 72 may repeat a step that deposits a first deposition film using the ion beam IB that is defocused with respect to the specimen S, a step that deposits a second deposition film on the first deposition film using the ion beam IB that is smaller in defocus amount than that used during the step that deposits the first deposition film, and a step that deposits a third deposition film on the second deposition film using the ion beam IB that is smaller in defocus amount than that used during the step that deposits the second deposition film to stack the deposition films. Note that up to a seventh deposition film is deposited in the example illustrated in FIG. 13.

Note that the above embodiments and modifications are merely examples, and the invention is not limited to the above embodiments and modifications. For example, the above embodiments and modifications may be appropriately combined.

The invention includes various other configurations substantially the same as the configurations described in connection with the above embodiments (e.g., a configuration having the same function, method, and results, or a configuration having the same objective and effects). The invention also includes a configuration in which an unsubstantial element described in connection with the above embodiments is replaced by another element. The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A deposition method that is implemented in a focused ion beam system that supplies a compound gas to a specimen, and applies an ion beam to the specimen to deposit a deposition film, the deposition method comprising:
   a first deposition film-depositing step that deposits a first deposition film on the specimen using the ion beam that is defocused with respect to the specimen; and
   a second deposition film-depositing step that deposits a second deposition film on the first deposition film using the ion beam that is smaller in defocus amount than that used in the first deposition film-depositing step.

2. The deposition method as defined in claim 1,
   wherein the first deposition film-depositing step deposits the first deposition film while decreasing the defocus amount with passing of time.

3. The deposition method as defined in claim 1,
   wherein the first deposition film-depositing step deposits the first deposition film while linearly decreasing the defocus amount.

4. The deposition method as defined in claim 1,
   wherein the first deposition film-depositing step deposits the first deposition film while curvilinearly decreasing the defocus amount.

5. A focused ion beam system comprising:
   a focused ion beam optical system that focuses an ion beam, and applies the focused ion beam to a specimen;
   a gas supply section that supplies a compound gas to the specimen; and
   a control section that controls the focused ion beam optical system,
   the control section including a stored program and processor for executing the stored program: said stored program defining a first process in which the ion beam that is defocused with respect to the specimen is applied to the specimen to which the compound gas is supplied, by controlling the focused ion beam optical system; and a second process in which the ion beam that is smaller in defocus amount than that used during the first process is applied to the specimen to which the compound gas is supplied, by controlling the focused ion beam optical system.

6. The focused ion beam system as defined in claim 5,
   wherein the first process directed by the stored program decreases the defocus amount with passing of time by controlling the focused ion beam optical system.

7. The focused ion beam system as defined in claim 5,
   wherein the first process directed by the stored program linearly decreases the defocus amount by controlling the focused ion beam optical system.

8. The focused ion beam system as defined in claim 5,
   wherein the first process directed by the stored program curvilinearly decreases the defocus amount by controlling the focused ion beam optical system.

* * * * *